United States Patent [19]

Galloway et al.

[11] Patent Number: 4,611,262

[45] Date of Patent: Sep. 9, 1986

[54] ELECTRICAL CIRCUIT PACKAGE FOR GREETING CARDS

[75] Inventors: Michael D. Galloway, Middletown; William H. Rose; David T. Shaffer, both of Harrisburg, all of Pa.

[73] Assignee: AMP Incorporated, Harrisburg, Pa.

[21] Appl. No.: 609,164

[22] Filed: May 11, 1984

[51] Int. Cl.⁴ .............................................. H05K 5/02
[52] U.S. Cl. .................................... 361/421; 206/232; 206/330; 235/487; 235/492; 357/70; 357/75
[58] Field of Search ...................... 176/52 FP; 200/46; 206/232, 328, 329, 330; 235/487, 492; 357/68, 70, 74, 75; 361/395, 398, 421, 401, 403; 369/63, 68; 40/455

[56] References Cited

U.S. PATENT DOCUMENTS

| | | | |
|---|---|---|---|
| 2,869,040 | 1/1959 | Pifer | 361/414 |
| 3,072,734 | 1/1963 | Fox et al. | 361/421 |
| 3,469,953 | 9/1969 | St. Clair et al. | 361/398 |
| 3,798,806 | 3/1974 | Sanford | 40/455 |
| 3,837,001 | 9/1974 | Hughes et al. | 357/70 |
| 3,978,375 | 8/1976 | Fukui et al. | 361/421 |
| 4,054,238 | 10/1977 | Lloyd et al. | 174/52 FP |
| 4,102,067 | 6/1978 | Tarrant | 40/455 |
| 4,168,404 | 9/1979 | Lockard | 361/421 |

Primary Examiner—Roy N. Envall, Jr.
Assistant Examiner—Gregory D. Thompson
Attorney, Agent, or Firm—Adrian J. LaRue; Anton P. Ness

[57] ABSTRACT

An electrical circuit package comprise a stamped and formed lead frame to which is molded a dielectric housing member which includes openings having exposed electrical contacts, the housing member providing support for the lead frame. Some of the exposed contacts in the openings serve to support electrical components in the openings and to make electrical contact therewith while other of the exposed contacts in the openings electrically engage the electrical components and maintain them in the openings. Further exposed contacts electrically engage another electrical component and the housing member and the further exposed contacts maintain the other electrical component in the housing member. An electrical switch is part of the lead frame.

13 Claims, 16 Drawing Figures

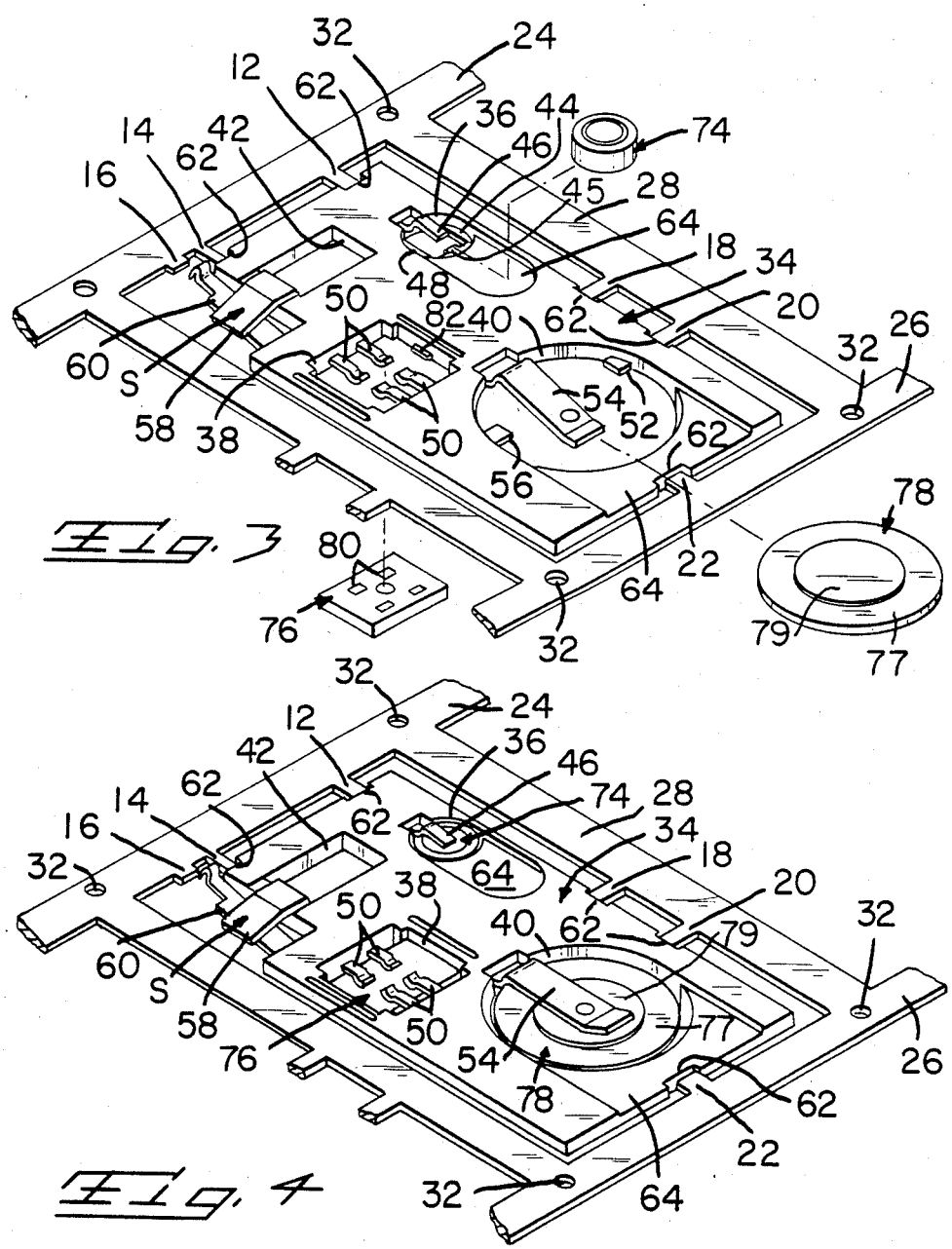

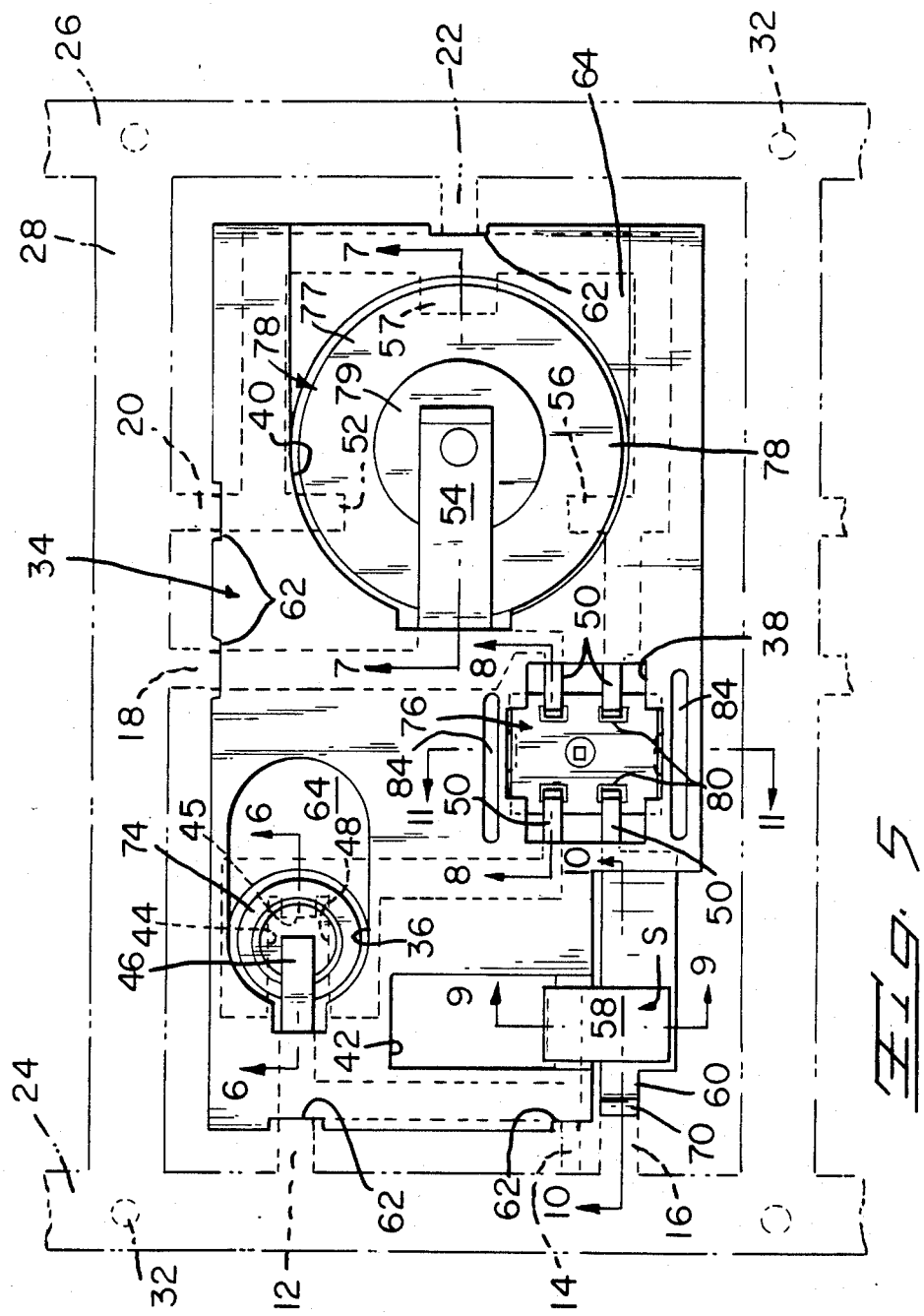

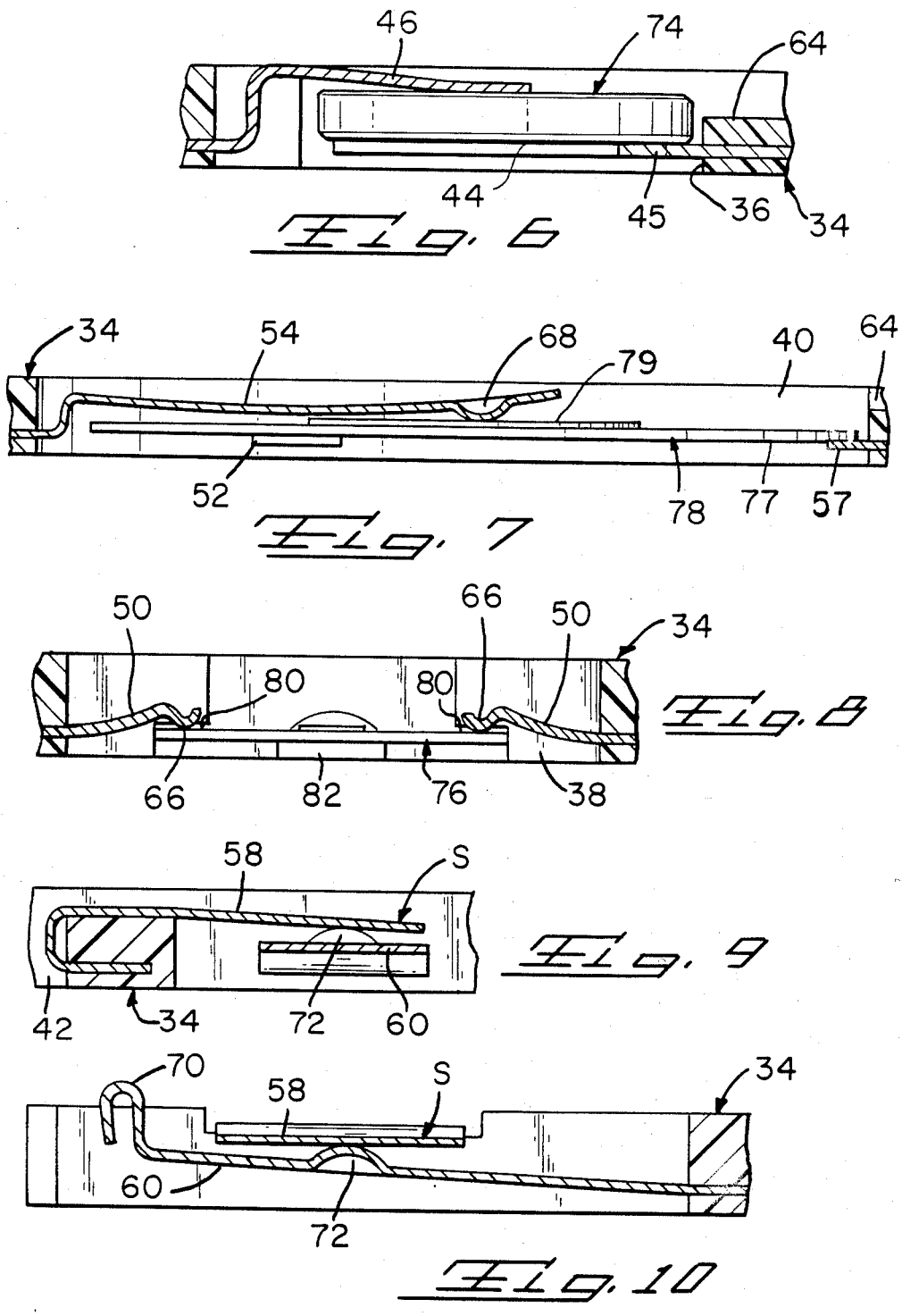

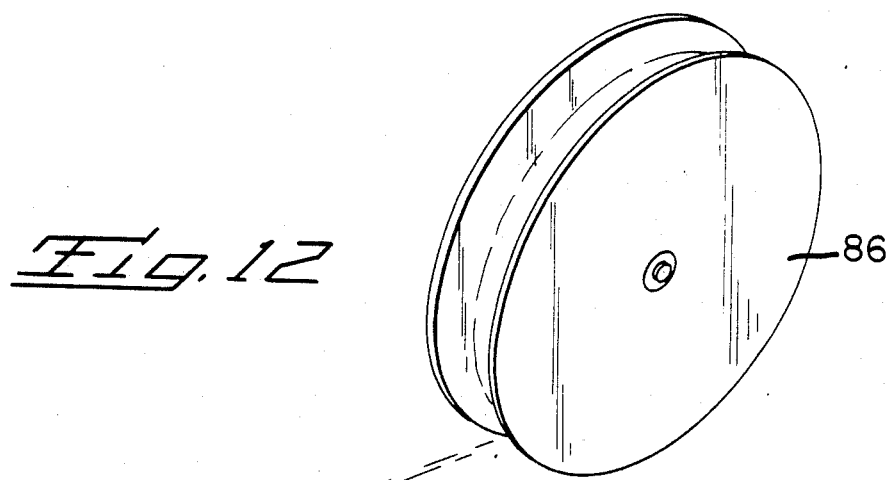
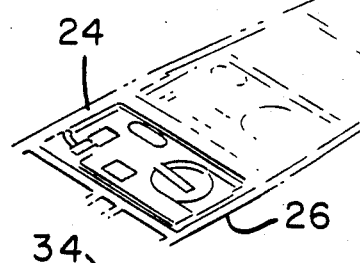
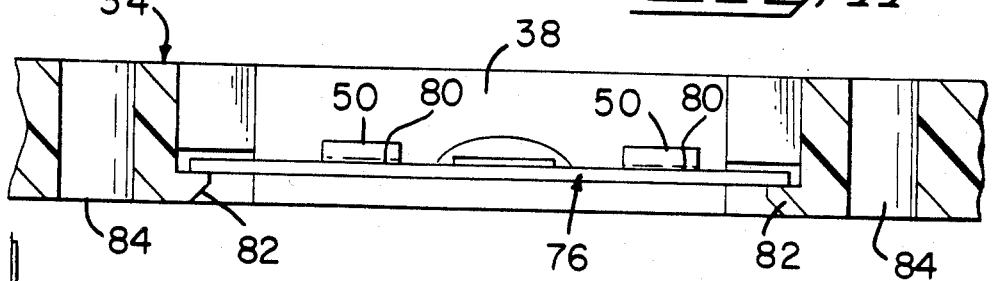
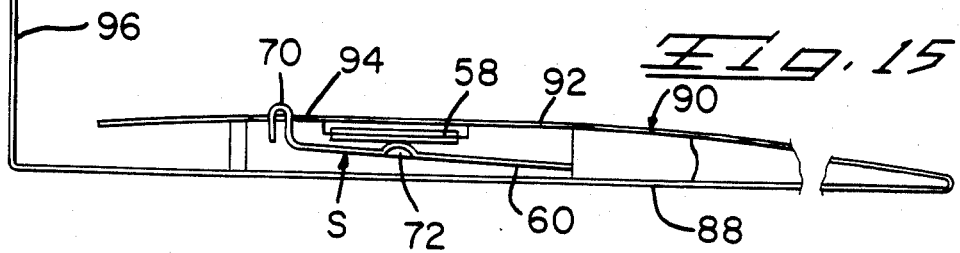
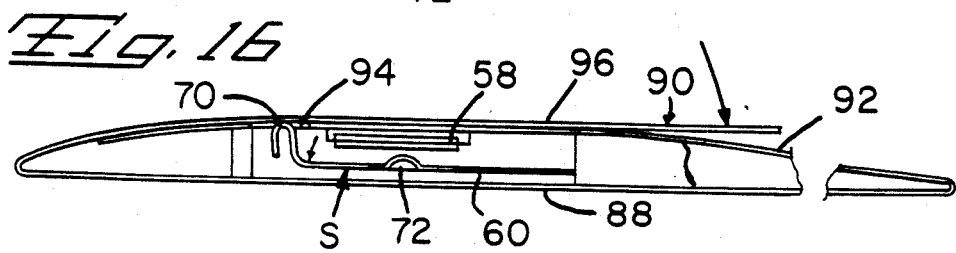

ELECTRICAL CIRCUIT PACKAGE FOR GREETING CARDS

FIELD OF THE INVENTION

This invention relates to electrical circuits and more particularly to electrical circuit packages for use in greeting cards.

BACKGROUND OF THE INVENTION

Greeting cards are known that have secured thereto electronic circuits that will play a tune such as, for example, "Happy Birthday" or other suitable tune depending on the occasion. These electronic circuits comprise very small printed circuit boards to which are attached a PROM, battery, piezoelectric transducer, and a wire switch. The transducer hangs loose from the circuit board via electrical leads and the wire switch extends outwardly from the circuit board. This assembly is then adhesively mounted onto the greeting card so that, when the card was closed the switch was open, and when the card was opened, the switch would close causing the PROM to generate signals that will activate the transducer thereby playing a tune.

The printed circuit board has to be procured or made, the components including the switch has to be manually soldered to the board with the speaker being unsupported. The battery clip is soldered onto the board and the PROM is wire bonded and epoxied in place which produces a thick and bulky package and the switch is susceptible to damage during handling in the mail.

SUMMARY OF THE INVENTION

According to the present invention, an electrical circuit package comprises a stamped and formed lead frame to which is molded a dielectric housing member which includes openings having exposed electrical contacts, the housing member providing support and insulation for the circuit paths of the lead frame. Some of the exposed contacts in the openings serve to support leadless electrical components in the openings and to make electrical contact therewith while other of the exposed contacts in the openings electrically engage the electrical components and maintain them in the openings. Further exposed contacts electrically engage another electrical component and the housing member and the further exposed contacts in conjunction with the housing member maintain the other electrical component in the housing member. An electrical switch is part of the lead frame.

According to another aspect of the present invention, a continuous strip of metal is stamped and formed to form a continuous strip of lead frames, dielectric housing members molded onto the lead frames with the housing members having openings exposing contact members therein thereby forming lead frame assemblies. The lead frame assemblies are subjected to a further forming operation so that at least one of the contact members in the openings is reformed into a spring contact member.

According to a further aspect of the present invention, an electrical circuit package for a greeting card comprises a stamped and formed lead frame to which is secured a dielectric housing member having openings therein, exposed contact members of the lead frame are located in the openings with some of the exposed contact members serving to support electrical components therein and make electrical engagement therewith while the other exposed contact members serve to maintain the electrical components in the openings and make electrical engagement therewith, and further exposed contact members of the lead frame define a switch. The circuit package is secured to one section of the greeting card and another section of the card covers the circuit package while a further section engages the other card section and the switch in the card's normally closed position to maintain the switch in an open position whereby when the further section of the card is moved away from the other section to open the card, the switch will close thereby activating the circuit of the electrical circuit package.

BRIEF DESCRIPTION OF THE DRAWINGS

FIG. 3 is a view similar to FIG. 2 showing further forming of the exposed contact members with electrical components exploded therefrom.

FIG. 4 is a view similar to FIG. 3 showing the lead frame assembly fully assembled as a completed electrical circuit package.

FIG. 5 is a top plan view of FIG. 4 with the carrier and cross strips in phantom.

FIGS. 6 to 11 are cross-sectional views taken along lines 6—6, 7—7, 8—8, 9—9, 10—10 and 11—11 respectively of FIG. 5.

FIG. 12 is a perspective view showing the lead frame assembly on a reel.

FIGS. 15 and 16 are cross-sectional views taken along lines 15—15 and 16—16 of FIGS. 13 and 14 respectively.

DETAILED DESCRIPTION OF THE INVENTION

Figure 1:
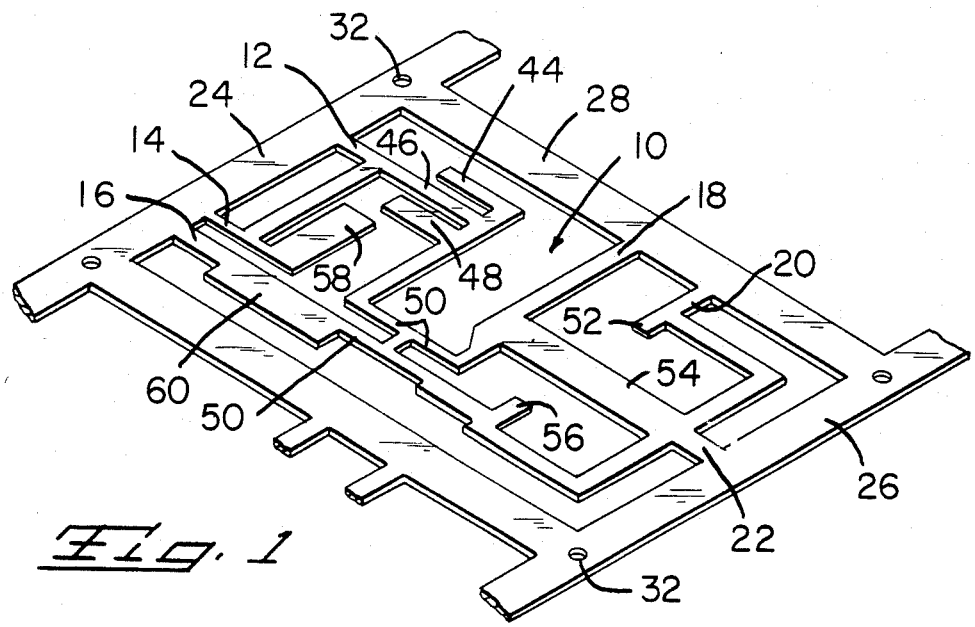
FIG. 1 is a perspective view of a stamped and formed lead frame as part of a continuous strip of lead frames.

FIG. 1 shows a stamped and formed lead frame 10 as part of a continuous strip of lead frames that has been stamped and formed in accordance with conventional stamping and forming practices from a strip of metal having the desirable electrical and spring characteristics. Metal strips 12,14,16,18,20 and 22 of lead frame 10 are connected to carrier strips 24 and 26 and cross strips 28 with carrier strips 24 and 26 having holes 32 therein.

Figure 2:
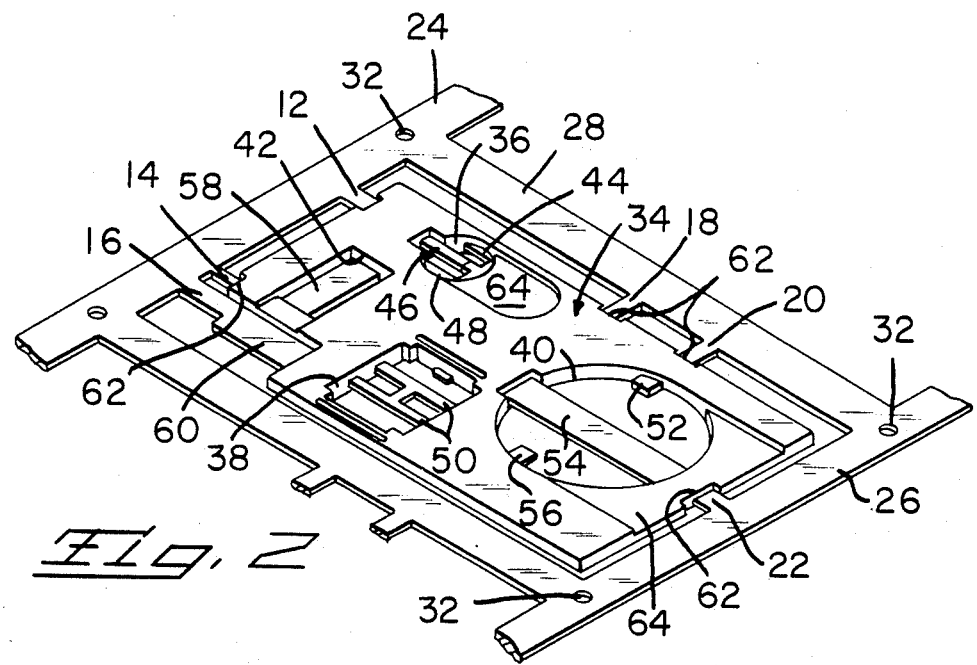
FIG. 2 is a perspective view showing a dielectric housing member molded onto the lead frame.
Figure 13:
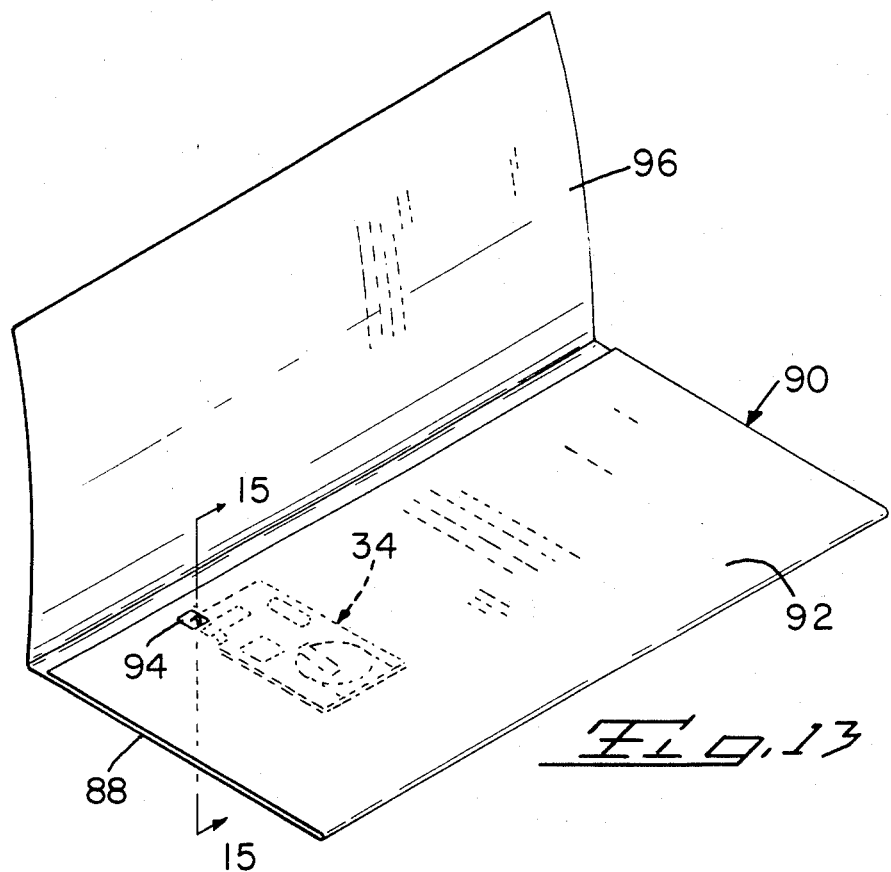
FIGS. 13 and 14 are perspective views of a greeting card with the electrical circuit package secured thereto and in the respective open and closed positions.

Lead frames 10 are then fed into a conventional mold via carrier strips 24, 26 and lead frames 10 have molded thereto a dielectric housing member 34 of a suitable dielectric material having the desirable dielectric properties and to lend support to the circuit paths of the lead frame as shown in FIGS. 2 through 5, as well as insulate the circuit paths. Housing member 34 is provided with openings 36,38,40 and 42 in which contact members 44,46,48,50,52,54,56,58 and 60 of lead frame 10 are exposed as shown in FIG. 2. Metal strips 12, 14 and 18,20 and 22 are disposed in recesses 62 of housing member 34. Recesses 64 are disposed in an upper surface of dielectric housing member 34 in communication with openings 36 and 40.

After dielectric housing member 34 has been molded to lead frames 10 to form a lead frame assembly, carrier strips 24, 26 are then used to feed the lead frame assembly into a conventional forming machine to subject the lead frame to a further forming operation whereby contact member 46 is sheared from contact members 44 and 48 and formed into a cantilever contact member as shown in FIGS. 5 and 6, with a contact member 45 left exposed in opening 36 as shown in FIG. 6; contact members 50 are formed into individual cantilever contact members having arcuate contact sections 66 at the free ends thereof as shown in FIG. 8; contact member 54 is sheared from contact members 52, 56 and formed into a cantilever contact member having a dimpled contact section 68 therein as shown in FIG. 7, contact member 58 is bent out of opening 42 overlying contact member 60, and contact member 60 is sheared from metal strip 16 with its free end being formed into a hook section 70 and it contains a dimpled contact section 72 therein in normal engagement with contact member 58 as shown in FIGS. 9 and 10 thereby forming switch S. When contact member 54 is sheared, a contact member 57 is left exposed in opening 40 as shown in FIG. 5.

After lead frames 10 have been reformed as shown in FIG. 3, the continuous strip of lead frame assemblies can be subjected to an assembly operation whereby leadless electrical components 74, 76 and 78 are inserted into openings 36, 38 and 40 respectively in electrical engagement with contact members 44,45,46,48,50,52,54,56 and 57 forming a completed electrical circuit package operable via the switch defined by contact members 58 and 60. The circuit package can be severed from carrier strips 24, 26 and cross strip 28 by severing metal strips 12, 14 and, 18,20 and 22 in recesses 62. Testing can also then be done.

Electrical component 74 is a conventional 1.5 volt DC battery with the positive terminal in engagement with contact members 44 and 48 to support the battery, and contact member 46 is in springable engagement with the negative terminal thereof to maintain the battery in position in opening 36. Recess 64 acts as a guide means to guide battery 74 into position in opening 36.

Electrical component 76 is a conventional PROM (Programmable Read Only Memory) mounted onto a small printed wiring board that will generate signals in the form of a selected tune and it has contact pads 80 thereon for electrical engagement with contact sections 66 of contact members 50 in opening 38. Flexible latching members 82 as shown in FIGS. 8 and 11 extend outwardly from opposite walls of opening 38 to latchably secure electrical component 76 in position in opening 38 in electrical engagement with contact sections 66 of contact members 50, and oblong holes 84 extend through housing member 34 to enable latching members 82 to be flexible.

Electrical component 78 is a conventional piezoelectric transducer of conventional construction which is disposed in opening 40 with its metal disc section 77 in electrical engagement with contact members 52, 56, and 57 to support the transducer, and electrical contact member 54 is in springable electrical engagement with the ceramic section 79 of the transducer to maintain the transducer in position in opening 40, recess 64 acting as a guide to position transducer 78 in position in opening 40. If battery 74 is inserted in position in opening 36, contacts 58 and 60 of switch S must be insulated from each other until the circuit package is installed in position; otherwise, battery 74 is not inserted into opening 36 until the circuit package is secured in position for use.

The continuous strip of circuit packages can be reeled onto a reel 86 as shown in FIG. 12, whereafter they can be unreeled therefrom and fed to an assembly operation for assembling the electrical components in position therein and the switch insulated, then the electrical packages are severed from the carrier and cross strips 24, 26 and 28 by severing metal strips 12, 14 and, 18,20 and 22 within recesses 62. The packages can then be tested for operation prior to being installed in place for intended use.

Figure 14:
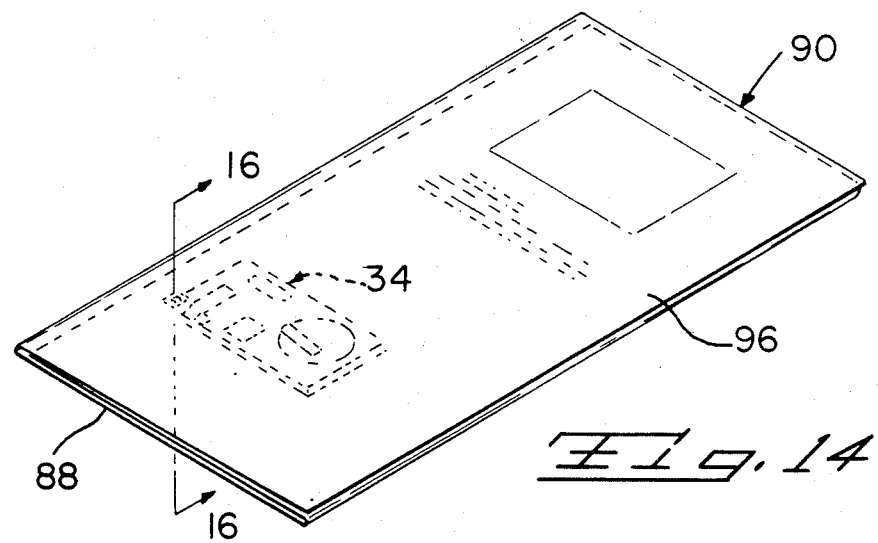

FIGS. 13 through 16 illustrate the intended use of the electrical circuit package in conjunction with a greeting card that will be in the form of a musical tune, spoken words, or both, from transducer 78. As shown, the completed electrical circuit package is secured onto an inside surface of a central section 88 of a greeting card 90 and the package is secured thereto by a conventional adhesive or other securing means. An outer section 92 of greeting card 90 is disposed over central section 88 covering the electric package and it has an opening 94 through which hook section 70 normally extends when greeting card 90 is opened to close the switch thereby activating the electric circuit in the circuit package. Other outer section 96 of greeting card 90 is disposed over outer section 92 as shown in FIGS. 14 and 16 to close greeting card 90 thereby engaging hook section 70 to open switch S and this will be the normal position for mailing the greeting card so that, while the greeting card is in its mailing envelope, the envelope will maintain the greeting card in its closed position to maintain switch S in its inoperative position so as not to activate the electrical circuit of the electric circuit package thereby draining the battery. It is only when the greeting card is taken out of its envelope and opened that switch S is closed thereby activating the electrical circuit thereby causing transducer 78 to generate audio signals in the form of a musical tune or spoken words or both, and it will operate in this manner so long as the greeting card is in its open position. The battery can be left out of the package until the card is mailed.

While the electrical circuit package is intended for use in conjunction with greeting cards, it can be used in other applications such as talking books, business cards, novelties, and other promotional articles.

A unique electrical circuit package has been disclosed which establishes an electrical circuit via a stamped and formed lead frame supported and insulated in a dielectric housing member which has exposed contact members in component-receiving openings in the housing member for electrical contact with components disposed in the openings and to maintain them therein to form an electrical circuit that is activated via a switch formed from other exposed contact members of the lead frame.

We claim:

1. An electrical circuit package, comprising:
   a stamped and formed metal lead frame including metal strips defining circuit paths for forming an electrical circuit; and
   a dielectric housing member secured onto said lead frame such that said circuit paths are insulatingly disposed in and supported by said housing member, said housing member having component-receiving openings in which electrical contact members of said metal strips are exposed in cooperating arrangements so that some of said exposed contact members serve to support leadless electrical components in respective said openings and to make electrical contact therewith while other of said exposed contact members in said openings electrically engage said electrical components and maintain them in said openings.

2. An electrical circuit package according to claim 1, wherein said housing member includes another component-receiving opening in which further exposed contact members are located for electrical engagement with another leadless electrical component, means provided by said housing member in conjunction with said further exposed contact members for maintaining said another electrical component in said another opening.

3. An electrical circuit package according to claim 2, wherein said maintaining means comprise flexible latch means extending outwardly from opposing walls of said another opening.

4. An electrical circuit package according to claim 1, wherein additional exposed contact members of said metal strips define switch means.

5. An electrical circuit package according to claim 1, wherein recesses are disposed in said housing member in communication with respective component-receiving openings to facilitate insertion of the electrical components into the openings.

6. A continuous strip of electrical circuit packages, comprising:
    stamped and formed metal lead frames including metal strips forming circuit paths and connected to carrier strips;
    dielectric housing members secured to respective lead frames such that said circuit paths are insulatingly disposed in and supported by a said housing member, each said housing member including component-receiving openings in which electrical contact members of said circuit paths are exposed in cooperating arrangements so that some of said exposed contact members serve to support leadless electrical components in respective side openings and to make electrical contact therewith while other of said exposed contact members in said openings electrically engage said electrical components and maintain them in said openings.

7. A continuous strip of electrical circuit packages according to claim 6, wherein each said housing member includes another component-receiving opening in which further exposed contact members are located for electrical engagement with another leadless electrical component, means provided by each said housing member in conjunction with said further exposed contact members for maintaining said another electrical component in said another opening.

8. A continuous strip of electrical circuit packages according to claim 7, wherein the maintaining means comprise flexible latch means extending outwardly from opposing walls of said another opening.

9. A continuous strip of electrical circuit packages according to claim 6, wherein additional exposed contact members of said circuit paths define switch means.

10. A continuous strip of electrical circuit packages according to claim 6, wherein each said housing member includes recesses in communication with respective component-receiving openings to facilitate insertion of said electrical components in respective said openings.

11. An electrical circuit package for a greeting card having a first section and a second section closeable thereagainst, comprising:
    a stamped and formed metal lead frame including metal strips defining circuit paths for forming an electric circuit;
    a dielectric housing member secured to said lead frame such that said circuit paths are insulatingly disposed in and supported by said housing member, said housing member having component-receiving openings in which electrical contact members of said circuit paths are exposed so that some of said exposed contact members serve to support leadless electrical components in respective said openings and to make electrical contact therewith while other of said exposed contact members in said openings electrically engage said electrical components and maintain them in said openings whereby when said electrical components are in said openings and in electrical engagement with said exposed contact members an electrical circuit package assembly is formed having a complete electrical circuit;
    said electrical circuit package assembly is securable onto said first section of said greeting card; and
    switch means formed by further exposed contact members of said circuit paths which is engaged by said second greeting card section when said greeting card is in a closed position to keep said switch means from activating said complete electrical circuit and when said greeting card is moved to an open position, said switch means closes thereby activating said complete electrical circuit.

12. An electrical circuit package according to claim 11, wherein said electrical circuit package assembly is securable onto an inside surface of said first section and a further section of said greeting card covers said electrical circuit package assembly.

13. An electrical circuit package according to claim 12, wherein said switch means has a hook section that extends through a hole in said further section.

* * * * *